United States Patent
Wu et al.

(10) Patent No.: US 12,337,674 B2
(45) Date of Patent: Jun. 24, 2025

(54) POWERTRAIN AND ELECTRIC VEHICLE

(71) Applicant: Huawei Digital Power Technologies Co., Ltd., Shenzhen (CN)

(72) Inventors: Hao Wu, Xi'an (CN); Jun Chen, Dongguan (CN); Quanming Li, Dongguan (CN)

(73) Assignee: HUAWEI DIGITAL POWER TECHNOLOGIES CO., LTD., Shenzhen (CN)

(*) Notice: Subject to any disclaimer, the term of this patent is extended or adjusted under 35 U.S.C. 154(b) by 356 days.

(21) Appl. No.: 17/966,980

(22) Filed: Oct. 17, 2022

(65) Prior Publication Data
US 2023/0040642 A1  Feb. 9, 2023

Related U.S. Application Data

(63) Continuation of application No. PCT/CN2021/071105, filed on Jan. 11, 2021.

(30) Foreign Application Priority Data

Apr. 17, 2020  (CN) .......................... 202020579731.7

(51) Int. Cl.
*B60K 11/04* (2006.01)
*B60K 1/00* (2006.01)

(52) U.S. Cl.
CPC ........ *B60K 11/04* (2013.01); *B60K 2001/003* (2013.01); *B60L 2240/425* (2013.01); *B60Y 2200/91* (2013.01); *B60Y 2400/61* (2013.01)

(58) Field of Classification Search
CPC .............. B60K 11/04; B60K 2001/003; B60L 2240/425; B60Y 2200/91; B60Y 2400/61
See application file for complete search history.

(56) References Cited

U.S. PATENT DOCUMENTS 8,485,931 B1 * 7/2013 Whitmarsh ......... F16H 61/0206
475/5
2018/0339583 A1 * 11/2018 Hirai ......................... B60L 9/18

FOREIGN PATENT DOCUMENTS

| CN | 205213192 U | 5/2016 |
|---|---|---|
| CN | 108691762 A | 10/2018 |
| CN | 109588019 A | 4/2019 |
| CN | 109756056 A | 5/2019 |
| CN | 209949748 U | 1/2020 |
| CN | 210167914 U | 3/2020 |
| EP | 2809138 A2 | 12/2014 |

* cited by examiner

*Primary Examiner* — Bryan A Evans
(74) *Attorney, Agent, or Firm* — Conley Rose, P.C.

(57) ABSTRACT

A powertrain includes: a motor control unit (1) including a housing (11) and a first functional unit (12) disposed in the housing (11) and capable of generating heat during operation; and a heat exchanger (2) disposed in the housing (11), where the heat exchanger (2) includes a first circulation channel (21) for a first cooling medium to circulate and a second circulation channel (22) for a second cooling medium to circulate. The first circulation channel (21) has a first external cooling surface (P1), and the first circulation channel (21) conducts heat with the first functional unit (12) at the first external cooling surface (P1); and/or the first circulation channel (21) has a second external cooling surface (P2), and the first circulation channel (21) conducts heat with an inner surface of the housing (11) at the second external cooling surface (P2).

20 Claims, 3 Drawing Sheets

POWERTRAIN AND ELECTRIC VEHICLE

CROSS-REFERENCE TO RELATED APPLICATIONS

This is a continuation of Int'l Patent App. No. PCT/CN2021/071105 filed on Jan. 11, 2021, which claims priority to Chinese Patent App. No. 202020579731.7 filed on Apr. 17, 2020, both of which are incorporated by reference.

FIELD

This disclosure relates to the field of vehicles, and in particular, to a powertrain and an electric vehicle.

BACKGROUND

A solution of integration (referred to as a powertrain) of a motor, a reducer, and a motor control unit (MCU) is adopted for a power drive system of an electric vehicle, to make the structure more compact and the weight lighter. In addition, in the powertrain, the inside of the motor is cooled by oil, the heated oil is cooled by a heat exchanger, and a component such as a power device in the MCU is cooled by a liquid cooling cold plate.

In the existing powertrain, the heat exchanger is externally disposed on a housing of the motor, hot oil in the motor is introduced into an internal circulation channel of the heat exchanger, cold water is introduced into an external circulation channel, and the oil exchanges heat with the water for cooling. The heat exchanger cools the oil in the motor alone, and an external cooling surface of the heat exchanger is exposed to the air, and is not fully used. In addition, the entire powertrain is not compact in structure and occupies relatively large space.

SUMMARY

To overcome the foregoing problems, this disclosure provides a powertrain and an electric vehicle, so that an external cooling surface of a heat exchanger can be fully used to improve utilization efficiency of the heat exchanger and heat dissipation of a motor control unit, a structure is more compact, and space is saved.

Therefore, the following technical solutions are used in embodiments:

According to a first aspect, an embodiment of provides a powertrain, including: a motor control unit including a housing and a first functional unit disposed in the housing and capable of generating heat during operation; and a heat exchanger disposed in the housing, where the heat exchanger includes a first circulation channel for a first cooling medium to circulate and a second circulation channel for a second cooling medium to circulate, where the first circulation channel has a first external cooling surface, and the first circulation channel conducts heat with the first functional unit at the first external cooling surface; and/or the first circulation channel has a second external cooling surface, and the first circulation channel conducts heat with an inner surface of the housing at the second external cooling surface.

Optionally, a first heat conduction interface material is disposed between the first external cooling surface and the first functional unit; and/or a second heat conduction interface material is disposed between the second external cooling surface and the inner surface of the housing.

Optionally, the motor control unit further includes a second functional unit disposed in the housing, the powertrain further includes a radiator disposed in the housing, and the radiator conducts heat with the second functional unit and the first functional unit.

Optionally, the second functional unit is a power module and includes at least one of a metal-oxide-semiconductor field-effect transistor (MOSFET), a gate turn-off thyristor (GTO), or an insulated-gate bipolar transistor (IGBT).

Optionally, a third heat conduction interface material is disposed between the radiator and the second functional unit; and/or a fourth heat conduction interface material is disposed between the radiator and the first functional unit.

Optionally, the first functional unit is disposed between the heat exchanger and the radiator; or the radiator is disposed between the heat exchanger and the first functional unit, and a part of the radiator conducts heat with the first external cooling surface.

Optionally, the first circulation channel is provided with a first outlet and a first inlet, the second circulation channel is provided with a third outlet and a third inlet, and the first outlet, the first inlet, the third outlet, and the third inlet extend out of the housing; and the radiator is provided with a second outlet and a second inlet, and the second outlet and the second inlet extend out of the housing.

Optionally, a pipeline of the radiator communicates with the first circulation channel, the second circulation channel is provided with a third outlet and a third inlet, the first circulation channel is provided with a fourth outlet, the radiator is provided with a fourth inlet, and the fourth outlet, the fourth inlet, the third outlet, and the third inlet extend out of the housing.

Optionally, the radiator and the heat exchanger are integrally made.

Optionally, the radiator includes a first cooling fin and a second cooling fin that are spaced and connected to each other, and the second functional unit is disposed between the first cooling fin and the second cooling fin.

Optionally, the first functional unit includes a bus capacitor.

According to a second aspect, an embodiment provides an electric vehicle including the powertrain according to the first aspect.

In the foregoing technical solution, because the heat exchanger is disposed in the housing of the motor control unit and the first circulation channel of the heat exchanger for the cooling medium to circulate has the first external cooling surface and/or the second external cooling surface, the first external cooling surface can be in heat conduction and contact with the first functional unit to cool the first functional unit and the second external cooling surface can be in heat conduction and contact with the inner surface of the housing to cool the housing. Compared with a solution in which an oil-water heat exchanger is externally disposed on a motor housing, the foregoing solution in which the heat exchanger is integrated into the motor control unit (that is, the heat exchanger is disposed in the housing of the motor control unit) enables the external cooling surface of the heat exchanger to be fully used to improve utilization efficiency of the heat exchanger and heat dissipation of the motor control unit, a structure is more compact, and space is saved.

Other features and advantages are described in detail in the subsequent part of description of embodiments.

BRIEF DESCRIPTION OF THE DRAWINGS

The following briefly describes the accompanying drawings used to describe embodiments or the conventional technology.

DETAILED DESCRIPTION

The following describes the technical solutions in embodiments with reference to accompanying drawings.

In descriptions, locations or location relationships indicated by terms "center", "up", "down", "in front of", "behind", "left", "right", "vertical", "horizontal", "top", "bottom", "inside", "outside", and the like are based on locations or location relationships shown in the accompanying drawings, and are merely intended for ease of describing this disclosure and simplifying descriptions, instead of indicating or implying that a mentioned apparatus or component needs to be provided on a specific location or constructed and operated on a specific location, and therefore shall not be understood as limitations on this disclosure.

In the descriptions, it should be noted that, unless otherwise clearly specified and limited, terms "mount", "link", and "connect" should be understood in a broad sense, for example, may mean a fixed connection, may be a detachable connection, or may be a butt joint connection or an integrated connection. Persons of ordinary skill in the art can understand specific meanings of the foregoing terms based on specific cases.

In the descriptions of this specification, the described specific features, structures, materials, or characteristics may be combined in a proper manner in any one or more of embodiments or examples.

Figure 1:
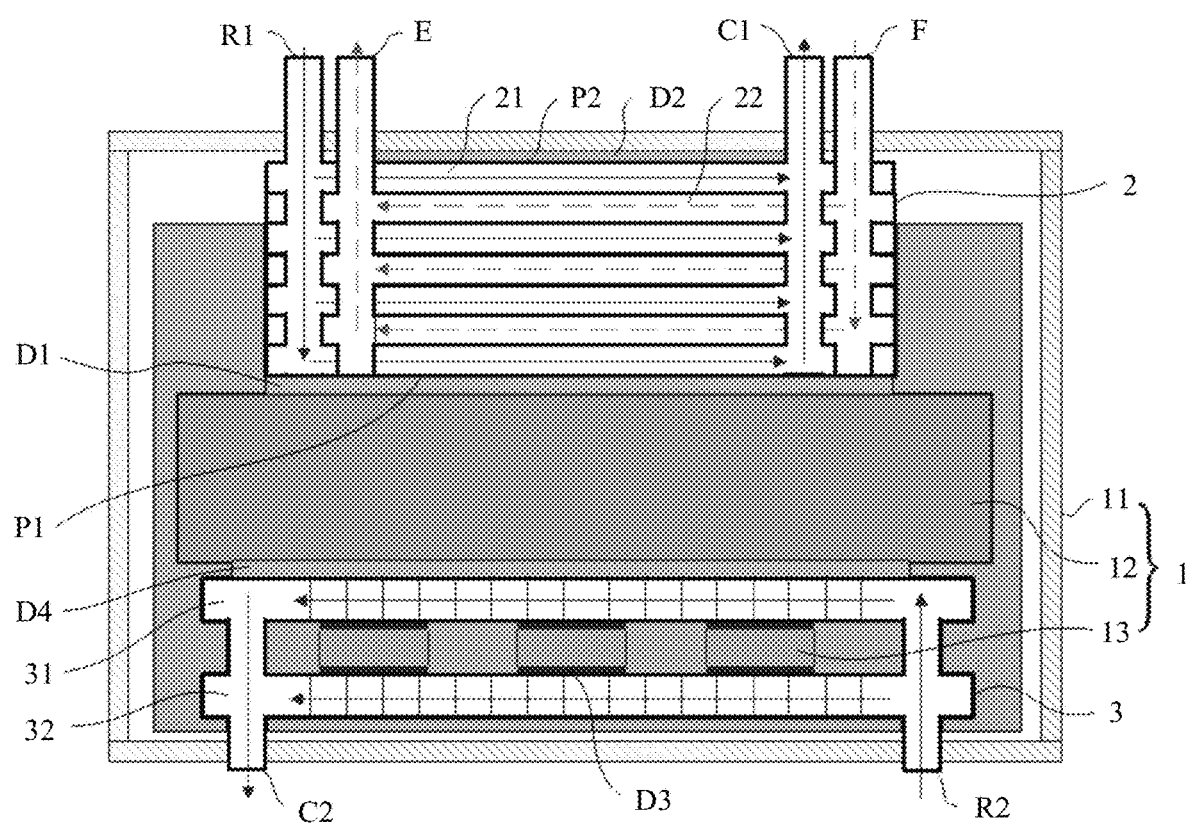
FIG. 1 is a schematic diagram of a structure of a powertrain according to Embodiment 1.

FIG. 1 is a schematic diagram of a structure of a powertrain according to Embodiment 1. As shown in FIG. 1, the powertrain includes a motor control unit 1 and a heat exchanger 2. The motor control unit 1 includes a housing 11 and a first functional unit 12 disposed in the housing 11 and capable of generating heat during operation. The heat exchanger 2 is disposed in the housing 11, and the heat exchanger 2 includes a first circulation channel 21 for a first cooling medium to circulate and a second circulation channel 22 for a second cooling medium to circulate. The first cooling medium may be water, and the second cooling medium may be oil for circulating inside a motor to cool the motor. In this case, the heat exchanger 2 may be an oil-water heat exchanger. The first circulation channel 21 may be disposed around the outside of the second circulation channel 22, so that the first circulation channel 21 can sufficiently cool the second circulation channel 22. In addition, in the heat exchanger 2, a path indicated by a solid arrow is a flow path of the first cooling medium such as water in the first circulation channel 21, while a path indicated by a dashed arrow is a flow path of the second cooling medium such as oil in the second circulation channel 22, and the flow path of the cooling water is opposite to that of the oil, to fully exchange heat. The first circulation channel 21 may have a first external cooling surface P1, and the first circulation channel 21 is in heat conduction and contact with the first functional unit 12 at the first external cooling surface P1. In this way, the first external cooling surface P1 may be used to cool the first functional unit 12, to dissipate heat generated by the first functional unit 12 as quickly as possible, thereby preventing the first functional unit 12 from overheating and ensuring normal operation of the first functional unit 12. Alternatively, the first circulation channel 21 may have a second external cooling surface P2, and the first circulation channel 21 is in heat conduction and contact with an inner surface of the housing 11 at the second external cooling surface P2. In this way, the second external cooling surface P2 may be used to cool the housing 11, to dissipate heat generated by the housing 11 as quickly as possible, thereby preventing the housing 11 from overheating, dissipating the heat inside the housing 11 as quickly as possible, and lowering an ambient temperature inside the housing 11, thereby ensuring that a device such as the first functional unit 12 in the housing 11 can operate normally.

It may be understood that the first circulation channel 21 may have both the first external cooling surface P1 and the second external cooling surface P2. For example, in FIG. 1, the first external cooling surface P1 and the second external cooling surface P2 may be two opposite surfaces of the heat exchanger 2. In addition, in case of need, the first circulation channel 21 may have more cooling surfaces.

In the foregoing technical solution, the heat exchanger 2 is disposed in the housing 11 of the motor control unit 1, and the first circulation channel 21 of the heat exchanger 2 for the cooling medium to circulate has the first external cooling surface P1 and/or the second external cooling surface P2, so that the first external cooling surface P1 can be in heat conduction and contact with the first functional unit 12 to cool the first functional unit 12, and the second external cooling surface P2 can be in heat conduction and contact with the inner surface of the housing 11 to cool the housing 11. Compared with a solution in which an oil-water heat exchanger is externally disposed on a motor housing, the foregoing solution in which the heat exchanger is integrated into the motor control unit (that is, the heat exchanger is disposed in the housing of the motor control unit) enables the external cooling surface of the heat exchanger to be fully used to improve utilization efficiency of the heat exchanger and heat dissipation of the motor control unit, a structure is more compact, and space is saved.

Still refer to FIG. 1. To improve an effect of heat conduction between the first external cooling surface P1 and the first functional unit 12, optionally, a first heat conduction interface material D1 is disposed between the first external cooling surface P1 and the first functional unit 12. Similarly, to improve an effect of heat conduction between the second external cooling surface P2 and the housing 11, a second heat conduction interface material D2 is disposed between the second external cooling surface P2 and the inner surface of the housing 11.

In addition, the motor control unit 1 further includes a second functional unit 13 disposed in the housing 11. The second functional unit 13 may be a power module, such as an IGBT, a MOSFET, or a GTO.

The powertrain further includes a radiator 3 disposed in the housing 11, and the radiator 3 is in heat conduction and contact with the second functional unit 13 and the first functional unit 12. A path indicated by a solid arrow in the radiator 3 is a flow path of a cooling medium. It should be noted that the first functional unit 12 may be a device other than the second functional unit. Optionally, the first functional unit 12 includes a bus capacitor.

In this case, the radiator 3 cools the second functional unit 13 and the first functional unit 12 (such as a capacitor) in the motor control unit 1 by using a cooling medium (such as water) to lower temperatures of the second functional unit 13 and the first functional unit 12. The heat exchanger 2 exchanges heat with and cools the oil in the motor by using the cooling water in the first circulation channel 21. In addition, the first external cooling surface P1 of the first circulation channel 21 of the heat exchanger 2 may cool and dissipate heat of the first functional unit 12 in the housing 11 of the motor control unit 1, and the second external cooling surface P2 of the first circulation channel 21 of the heat exchanger 2 may dissipate heat of the housing 11 of the motor control unit 1, thereby improving utilization efficiency of the heat exchanger 2, improving heat dissipation of the motor control unit 1, and lowering an internal ambient temperature of the motor control unit 1. In addition, integrating the heat exchanger 2 into the motor control unit 1 may further improve an integration degree, make the structure more compact, and save space.

Further, the radiator 3 may include a first cooling fin 31 and a second cooling fin 32 that are spaced and connected to each other, and the second functional unit 13 is disposed between the first cooling fin 31 and the second cooling fin 32. In this way, the first cooling fin 31 and the second cooling fin 32 may better cool and dissipate heat of the second functional unit 13.

To improve an effect of heat conduction between the radiator 3 and the second functional unit 13, a third heat conduction interface material D3 may be disposed between the radiator 3 and the second functional unit 13. Similarly, to improve an effect of heat conduction between the radiator 3 and the first functional unit 12, a fourth heat conduction interface material D4 may be disposed between the radiator 3 and the first functional unit 12.

In addition, in the powertrain of Embodiment 1 shown in FIG. 1, the first functional unit 12 is disposed between the heat exchanger 2 and the radiator 3. In this case, the first circulation channel 21 may be provided with a first outlet C1 and a first inlet R1, the second circulation channel 22 may be provided with a third outlet E and a third inlet F, and the first outlet C1, the first inlet R1, the third outlet E, and the third inlet F extend out of the housing 11. The radiator 3 may be provided with a second outlet C2 and a second inlet R2, and the second outlet C2 and the second inlet R2 extend out of the housing 11.

Figure 2:
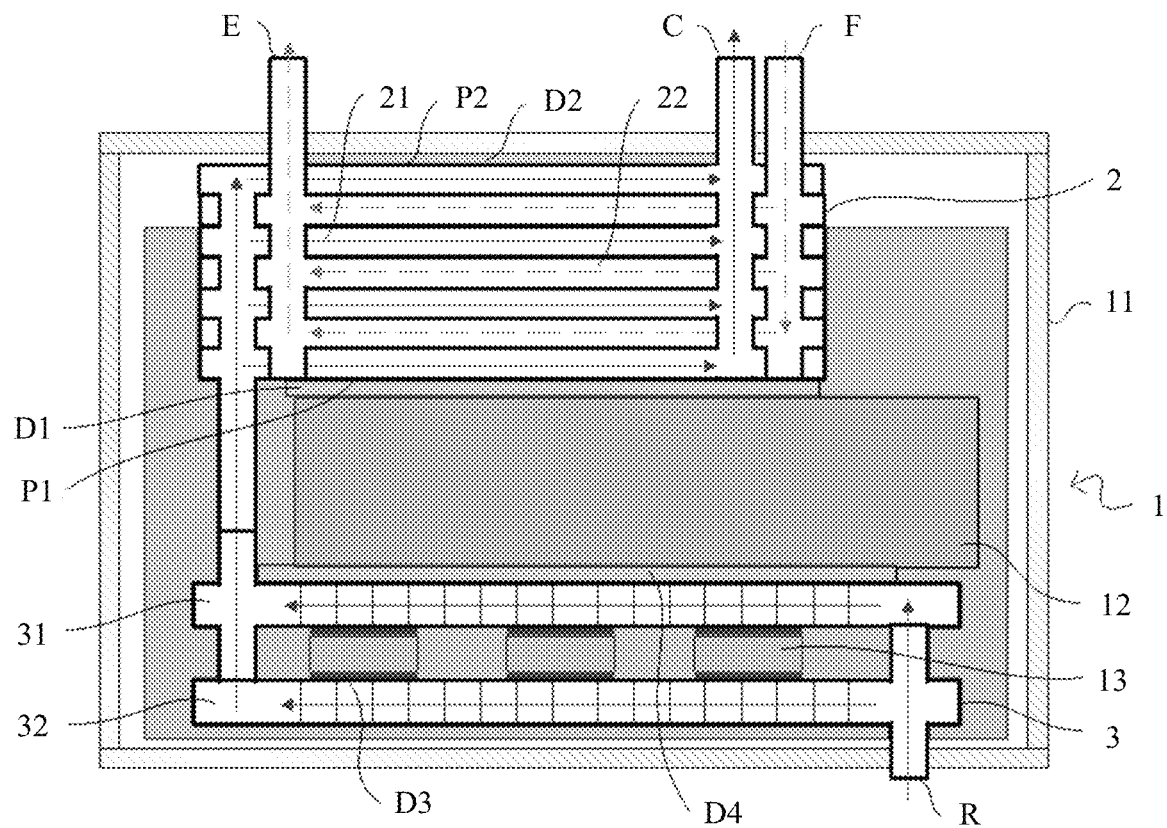
FIG. 2 is a schematic diagram of a structure of a powertrain according to Embodiment 2.

FIG. 2 is a schematic diagram of a structure of a powertrain according to Embodiment 2. The powertrain of Embodiment 2 shown in FIG. 2 differs from the powertrain of Embodiment 1 shown in FIG. 1 in that a pipeline of the radiator 3 communicates with the first circulation channel 21 of the heat exchanger 2. In this case, the flow path of the cooling medium in the first circulation channel 21 (the path indicated by the solid arrow) and the flow path of the oil in the second circulation channel 22 (the path indicated by the dashed arrow) are opposite to each other, to fully exchange heat. The second circulation channel 22 of the heat exchanger 2 may be provided with a third outlet E and a third inlet F, the first circulation channel 21 may be provided with a fourth outlet C, the radiator 3 may be provided with a fourth inlet R, and the fourth outlet C, the fourth inlet R, the third outlet E, and the third inlet F extend out of the housing 11. In this way, after entering from the fourth inlet R on the radiator 3, the cooling medium first circulates in the radiator 3 to cool and dissipate heat of the second functional unit 13 and the first functional unit 12 (such as a capacitor) in the motor control unit 1, then enters the first circulation channel 21 of the heat exchanger 2 to exchange heat with the oil in the second circulation channel 22 of the heat exchanger 2, and finally flows out from the fourth outlet C on the first circulation channel 21. Compared with that of the powertrain of Embodiment 1, in a cooling system of this solution, one outlet and one inlet are reduced, that is, a quantity of cooling interfaces is reduced, which facilitates installation and can reduce costs.

Still refer to FIG. 2. In this case, the first cooling fin 31 and the second cooling fin 32 may have a same structure. In this way, the first cooling fin 31 and the second cooling fin 32 of the second functional unit 13 may be designed into a structure in a normalized manner, so that the first cooling fin 31 and the second cooling fin 32 can be manufactured in a same process, which reduces costs.

Figure 3:
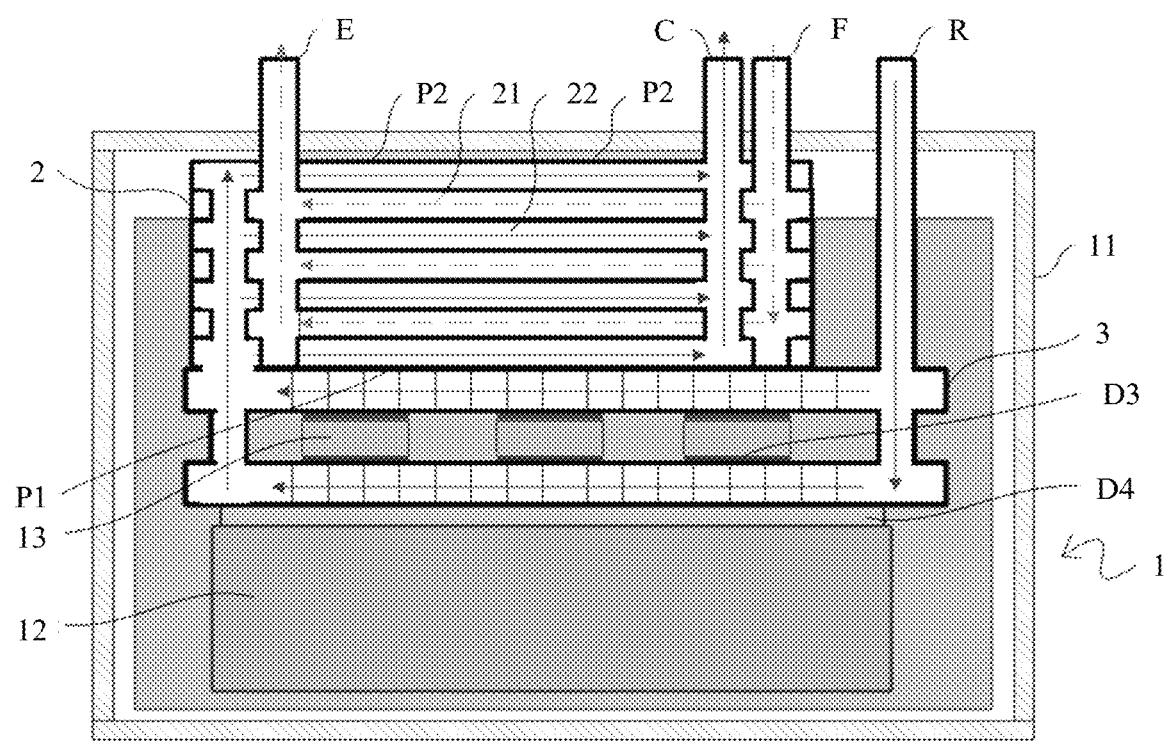
FIG. 3 is a schematic diagram of a structure of a powertrain according to Embodiment 3.

FIG. 3 is a schematic diagram of a structure of a powertrain according to Embodiment 3. As shown in FIG. 3, the radiator 3 is disposed between the heat exchanger 2 and the first functional unit 12, and a part of the radiator 3 may be in heat conduction and contact with the first external cooling surface P1. In this case, the radiator 3 and the heat exchanger 2 may be integrally made. That is, the radiator 3 and the heat exchanger 2 may be integrated together as a heat dissipation component. This can reduce a processing and manufacturing time, reduce a quantity of cooling interfaces and components, and make installation more convenient.

In addition, the powertrain of Embodiment 3 shown in FIG. 3 is similar to the powertrain of Embodiment 2 shown in FIG. 2 in that the radiator 3 communicates with the first circulation channel 21 of the heat exchanger 2. However, in the powertrain of Embodiment 3 shown in FIG. 3, because the radiator 3 may be directly disposed at the bottom of the heat exchanger 2, the cooling medium may directly enter the first circulation channel 21 of the heat exchanger 2 from the radiator 3, to exchange heat with and cool the oil in the second circulation channel 22 of the heat exchanger 2. In the powertrain of Embodiment 2 shown in FIG. 2, because the first functional unit 12 is disposed between the heat exchanger 2 and the radiator 3, that is, the heat exchanger 2 and the radiator 3 are spaced, the cooling medium needs to pass through a pipeline after coming out of the radiator 3, and then enters the first circulation channel 21 of the heat exchanger 2.

An embodiment further provides an electric vehicle including the foregoing powertrain. Because the electric vehicle includes the powertrain, the electric vehicle has all or at least some advantages of the powertrain.

Finally, it should be noted that the foregoing embodiments are merely intended for describing the technical solutions, but not for limiting this disclosure. Although this disclosure is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of embodiments.

What is claimed is:

1. A powertrain comprising:
   a motor control unit comprising:
      a housing comprising an inner surface; and
      a first functional unit disposed in the housing and configured to generate heat during operation; and
   a heat exchanger disposed in the housing and comprising:
      a second circulation channel configured to circulate a second cooling medium; and
      a first circulation channel comprising a first external cooling surface or a second external cooling surface and configured to:
         cool the second circulation channel;
         circulate a first cooling medium; and
         conduct heat with the first functional unit at the first external cooling surface or conduct heat with the inner surface at the second external cooling surface.

2. The powertrain of claim 1, further comprising either a first heat conduction interface material disposed between the first external cooling surface and the first functional unit or a second heat conduction interface material disposed between the second external cooling surface and the inner surface of the housing.

3. A powertrain comprising:
a motor control unit comprising:
a housing comprising an inner surface;
a first functional unit disposed in the housing and configured to generate heat during operation; and
a second functional unit disposed in the housing;
a heat exchanger disposed in the housing and comprising:
a second circulation channel configured to circulate a second cooling medium; and
a first circulation channel comprising a first external cooling surface or a second external cooling surface and configured to:
circulate a first cooling medium; and
conduct heat with the first functional unit at the first external cooling surface or conduct heat with the inner surface at the second external cooling surface; and
a radiator disposed in the housing and configured to conduct heat with the second functional unit and the first functional unit.

4. The powertrain of claim 3, wherein the second functional unit is a power module and comprises a metal-oxide-semiconductor field-effect transistor (MOSFET), a gate turn-off thyristor (GTO), or an insulated-gate bipolar transistor (IGBT).

5. The powertrain of claim 3, further comprising either a third heat conduction interface material disposed between the radiator and the second functional unit or a fourth heat conduction interface material disposed between the radiator and the first functional unit.

6. The powertrain of claim 3, wherein the first functional unit is disposed between the heat exchanger and the radiator, or wherein the radiator is disposed between the heat exchanger and the first functional unit and a part of the radiator is configured to conduct heat with the first external cooling surface.

7. The powertrain of claim 6, wherein the first circulation channel comprises a first outlet and a first inlet, wherein the second circulation channel comprises a third outlet and a third inlet, wherein the first outlet, the first inlet, the third outlet, and the third inlet extend out of the housing, wherein the radiator comprises a second outlet and a second inlet, and wherein the second outlet and the second inlet extend out of the housing.

8. The powertrain of claim 6, wherein the radiator comprises a pipeline configured to communicate with the first circulation channel, wherein the second circulation channel comprises a third outlet and a third inlet, wherein the first circulation channel comprises a fourth outlet, wherein the radiator comprises a fourth inlet, and wherein the fourth outlet, the fourth inlet, the third outlet, and the third inlet extend out of the housing.

9. The powertrain of claim 8, wherein the radiator and the heat exchanger are integrated with each other.

10. The powertrain of claim 3, wherein the radiator comprises a first cooling fin and a second cooling fin connected to each other, and wherein the second functional unit is disposed between the first cooling fin and the second cooling fin.

11. The powertrain of claim 7, wherein the first functional unit comprises a bus capacitor.

12. An electric vehicle comprising
a powertrain comprising:
a motor control unit comprising:
a housing comprising an inner surface; and
a first functional unit disposed in the housing and configured to generate heat during operation; and
a heat exchanger disposed in the housing and comprising:
a second circulation channel configured to circulate a second cooling medium; and
a first circulation channel comprising a first external cooling surface or a second external cooling surface and configured to:
cool the second circulation channel;
circulate a first cooling medium; and
conduct heat with the first functional unit at the first external cooling surface or conduct heat with the inner surface at the second external cooling surface.

13. The electric vehicle of claim 12, wherein the powertrain further comprises a first heat conduction interface material disposed between the first external cooling surface and the first functional unit or a second heat conduction interface material disposed between the second external cooling surface and the inner surface of the housing.

14. The electric vehicle of claim 12, wherein the motor control unit further comprises a second functional unit disposed in the housing, and wherein the powertrain further comprises a radiator disposed in the housing and configured to conduct heat with the second functional unit and the first functional unit.

15. The electric vehicle of claim 14, wherein the second functional unit is a power module and comprises a metal-oxide-semiconductor field-effect transistor (MOSFET), a gate turn-off thyristor (GTO), or an insulated-gate bipolar transistor (IGBT).

16. The electric vehicle of claim 14, wherein the powertrain further comprises either a third heat conduction interface material disposed between the radiator and the second functional unit or a fourth heat conduction interface material disposed between the radiator and the first functional unit.

17. The electric vehicle of claim 14, wherein the first functional unit is disposed between the heat exchanger and the radiator, or wherein the radiator is disposed between the heat exchanger and the first functional unit and a part of the radiator is configured to conduct heat with the first external cooling surface.

18. The electric vehicle of claim 17, wherein the first circulation channel comprises a first outlet and a first inlet, wherein the second circulation channel comprises a third outlet and a third inlet, wherein the first outlet, the first inlet, the third outlet, and the third inlet extend out of the housing, wherein the radiator comprises a second outlet and a second inlet, and wherein the second outlet and the second inlet extend out of the housing.

19. The electric vehicle of claim 17, wherein the radiator comprises a pipeline configured to communicate with the first circulation channel, wherein the second circulation channel comprises a third outlet and a third inlet, wherein the first circulation channel comprises a fourth outlet, wherein the radiator comprises a fourth inlet, and wherein the fourth outlet, the fourth inlet, the third outlet, and the third inlet extend out of the housing.

20. The electric vehicle of claim 19, wherein the radiator and the heat exchanger are integrated with each other.

* * * * *